(12) United States Patent
Yamashita et al.

(10) Patent No.: US 6,525,260 B2
(45) Date of Patent: Feb. 25, 2003

(54) THERMOELECTRIC CONVERSION MATERIAL, AND METHOD FOR MANUFACTURING SAME

(75) Inventors: Osamu Yamashita, Ibaraki (JP); Nobuhiro Sadatomi, Ibaraki (JP); Tsunekazu Saigo, Matsubara (JP)

(73) Assignee: Sumitomo Special Metals Co., Ltd., Osaka (JP)

( * ) Notice: Subject to any disclaimer, the term of this patent is extended or adjusted under 35 U.S.C. 154(b) by 0 days.

(21) Appl. No.: 09/931,838

(22) Filed: Aug. 17, 2001

(65) Prior Publication Data

US 2002/0088485 A1 Jul. 11, 2002

(30) Foreign Application Priority Data

Aug. 18, 2000 (JP) ......................................... 2000-248285

(51) Int. Cl.[7] .............................................. H01L 35/14
(52) U.S. Cl. .................... 136/239; 136/201; 136/236.1; 136/240; 419/48
(58) Field of Search ............................. 136/236.1, 239, 136/240, 200, 201; 419/48

(56) References Cited

U.S. PATENT DOCUMENTS 6,188,011 B1 * 2/2001 Nolas et al. .............. 136/236.1
6,423,286 B1 * 7/2002 Gryko ....................... 423/344

FOREIGN PATENT DOCUMENTS

EP      1074512    *  7/2001

OTHER PUBLICATIONS

Nolas, G.S., Cohn, J.L., Nelson, E., "Transport properties of tin clathrates", Aug. 1999, 18th INternational Conference on Thermoelectrics, pp. 493–495.*

Kuznetsov, V.I., Kuznetsov, L. A., Kaliazin, A. E., Rowe, D. M., Preparation and thermoelectric properties of A/sub 8//sup II/B/sub 16//supIII/B/sub 30//sup IV, Aug. 1999, 18th International Conference on Thermoelectrics, pp. 177–180.*

* cited by examiner

Primary Examiner—Nam Nguyen
Assistant Examiner—Thomas H. Parsons
(74) Attorney, Agent, or Firm—Kilyk & Bowersox, P.L.L.C.

(57) ABSTRACT

A silicon-based polycrystal powder, which contains no more than 30 at % Ge, C, Sn, or another such element that does not generate carriers as well as an added element that does generate carriers, and which has a crystal structure including crystal grains made up of at least 80 at % silicon, and a grain boundary phase where at least one type of said added element is precipitated at the boundary of said crystal grains, is mixed with a clathrate compound powder with low thermal conductivity and electrical resistivity, and this mixture is subjected to hot compression molding, the product of which has a composite structure in which the particles of the clathrate compound polycrystals are disposed around the particles of the silicon-based polycrystals.

9 Claims, 1 Drawing Sheet

THERMOELECTRIC CONVERSION MATERIAL, AND METHOD FOR MANUFACTURING SAME

BACKGROUND OF THE INVENTION

1. Field of the Invention

The present invention relates to a novel thermoelectric conversion material in which a silicon-based polycrystal powder having a crystal structure that includes crystal grains composed of a silicon-rich phase, and a doped element-rich phase in which at least one element is precipitated at the crystal grain boundary, is compounded with an AGaT polycrystal powder with a low thermal conductivity. The present invention also relates to a method for manufacturing a thermoelectric conversion material with a low thermal conductivity, resulting in high thermoelectric conversion efficiency.

2. Description of the Related Art

Thermoelectric conversion elements are devices that are expected to see practical use because of their efficient utilization of the high levels of thermal energy required in industrial fields today. An extremely broad range of applications have been investigated, such as a system for converting waste heat into electrical energy, small and portable electric generators for easily obtaining electricity outdoors, flame sensors for gas equipment, and so forth.

That thermal conductivity can be lowered and the thermoelectric figure of merit raised by the addition of germanium to silicon is known from the reports of J. P. Dismukes et al. (J. Appl. Phys., 35 (1964), 2899) and N.Kh. Abrikosov et al. (Sov. Phys. Semicon., 2 (1969), 1468).

It is also already known that thermal conductivity can be markedly lowered by using a solid solution of hetero elements in a semiconductor based on Si—Ge or InAs—GaAs ("Thermoelectric Conductors and Their Applications," by K. Uemura and T. Nishida).

This Si—Ge system is a solid solution in any composition, in the phase diagram of which there is a large temperature differential between the liquidus and solidus, and a problem has been that the silicon and germanium are prone to segregation. Also, the above-mentioned Si—Ge-based materials containing at least 20% germanium have yet to see widespread use, since germanium is a costly raw material.

Meanwhile, G. S. Nolas (Mat. Res. Soc. Symp. Proc., 545 (1999), 435) has reported that clathrate compounds based on Group 4 elements have a complex cage structure, and have an extremely low thermal conductivity due to the "rattling effect" caused by atoms introduced into the cage-like cluster.

The inventors turned their attention to the fact that silicon, which is widely used in semiconductor devices, has an extremely high Seebeck coefficient, and in particular examined the thermoelectric characteristics of silicon-based materials, and as a result learned that the addition of a small amount (0.001 to 20 at %) of another element to silicon yields a thermoelectric conversion material having a high figure of merit (WO99/22410).

The thermal conductivity of the above-mentioned silicon-based materials can be lowered by using various doping elements, and the Seebeck coefficient at a specific carrier concentration will be equivalent to or better than that of conventional Si—Ge and Fe—Si compounds. Such a material exhibits a good figure of merit as a thermoelectric conversion material, allowing it to contribute to higher performance.

In general, thermal conductivity ($\kappa$) is the sum of conduction ($\kappa$el) by carriers (free electrons) and conduction ($\kappa$ph) by phonons. Since conduction by phonons is dominant in the semiconductor region (carrier concentration <$10^{21}$ M/m$^3$), the scattering of phonons needs to increase in order to lower the thermal conductivity.

Adding impurity elements to the silicon is effective to this end, but there is a limit to the amount of Group 2 and 3 or Group 5 and 6 elements, transition metal elements, and rare earth elements that can be added, and the thermal conductivity that could be achieved at room temperature with such a method was only about 10 W/mK at best.

The value of this thermal conductivity ($\kappa$) is still about one order of magnitude larger than that of other thermoelectric materials, and thermal conductivity needs to be further lowered in order to further increase the thermoelectric figure of merit (Z).

SUMMARY OF THE INVENTION

It is an object of the present invention to provide a thermoelectric conversion material, and a method for manufacturing this material, with which the thermal conductivity of a silicon-based thermoelectric conversion material can be greatly lowered without lowering the Seebeck coefficient or electrical conductivity of the material, which affords a marked increase in the thermoelectric figure of merit.

As a result of various investigations into the compounding of a silicon-based thermoelectric conversion material (silicon-based polycrystals) with other materials in an effort to lower the thermal conductivity of said silicon-based material, the inventors discovered that the thermal conductivity can be lowered considerably without greatly sacrificing the Seebeck coefficient by compounding this silicon-based material with a material that has a lower thermal conductivity than silicon-based polycrystals and that also has lower electrical resistivity.

The inventors perfected the present invention upon discovering that a thermoelectric conversion material with a markedly lower thermal conductivity can be obtained without sacrificing a high Seebeck coefficient and low electrical resistivity by mixing a silicon-based polycrystal powder composed of a p- or n-type semiconductor in which any of various elements have been added to a silicon-based material containing germanium, for example, in an amount of 0.05 to 10 at % to adjust the carrier concentration to between $10^{19}$ and $10^{21}$ M/m$^3$, at which the Seebeck coefficient is high, with a separately prepared clathrate compound having low thermal conductivity and electrical resistivity, and then compounding this mixture by hot pressing.

Specifically, the thermoelectric conversion material pertaining to the present invention is a composite of silicon-based polycrystals and AGaT polycrystals, wherein these silicon-based polycrystals have a crystal structure containing an added element or a combination of added elements in an amount of 0.001 to 30 at % and include crystal grains made up of 80 at % silicon, and a grain boundary phase where at least one type of said added element is precipitated at the boundary of the crystal grains, and these AGaT polycrystals contain at least one Group II-A element selected from among Be, Mg, Ca, Sr, and Ba as A, and at least one Group IV-A element selected from among C, Si, Ge, Sn, and Pb as T.

The inventors also propose thermoelectric conversion materials having the structures of the following 1) to 5) as variations on the thermoelectric conversion material with the above structure.

1) Wherein the thermoelectric conversion material has a structure in which the particles of the AGaT polycrystals are disposed around the particles of the silicon-based polycrystals;

2) Wherein the added element in the silicon-based polycrystals include 0.1 to 10 at % of at least one of added element that does not generate carriers and 0.002 to 20 at % of at least one type of added element that does generate carriers, and the added element that does generate carriers includes at least one element selected from among Ge, C, and Sn;

3) Wherein the AGaT polycrystals have a compositional formula of $A_XGa_YT_Z$, where X=8, Y=14 to 17, and Z=28 to 32;

4) Wherein the silicon-based polycrystals are of the same conduction type as the AGaT polycrystals; and 5) Wherein the mixing weight ratio of the silicon-based polycrystals and the AGaT polycrystals is 60:40 to 90:10.

The inventors further propose a method for manufacturing a thermoelectric conversion material, characterized by comprising the steps of mixing (mixing and pulverizing) a silicon-based polycrystal powder and an AGaT polycrystal powder, and compounding the mixed powder by hot compression molding, such as hot pressing or discharge plasma sintering, or more specifically, creating a composite structure in which particles of clathrate compound polycrystals are disposed around the particles of the silicon-based polycrystals.

With the present invention, the thermal conductivity of silicon-based polycrystals having a high thermoelectric figure of merit can be greatly lowered without lowering the Seebeck coefficient or electrical conductivity of this thermoelectric conversion material, which affords a marked increase in the thermoelectric figure of merit.

DESCRIPTION OF THE PREFERRED EMBODIMENTS

Figure 1:
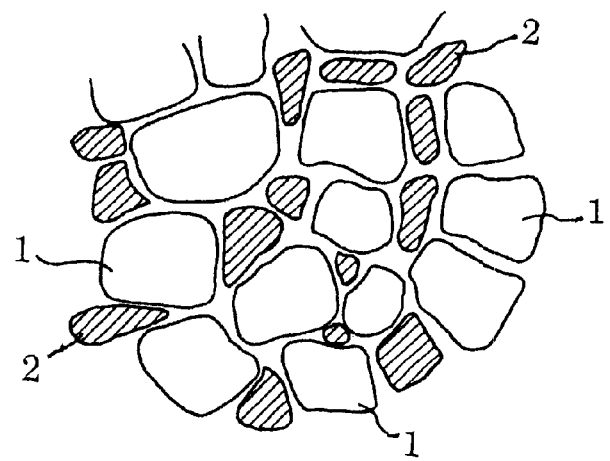
FIG. 1 is a schematic diagram of the composite structure of the thermoelectric conversion material pertaining to the present invention, which is composed of silicon-based polycrystals and AGaT polycrystals.

As shown in FIG. 1, the crystal structure of the thermoelectric conversion material pertaining to the present invention, which is composed of silicon-based polycrystals and AGaT polycrystals, is characterized in that the particles of the AGaT polycrystals (called AGaT polycrystal particles 2) are disposed around the particles of silicon-based polycrystals (called silicon-based polycrystal particles 1).

The thermal conductivity of a thermoelectric material in which silicon-based polycrystal particles are compounded with AGaT polycrystal particles is much lower than the thermal conductivity of SiGe because of the compounding of an AGaT compounding having a low thermal conductivity, and furthermore the electrical resistivity is also reduced without the Seebeck coefficient being greatly diminished.

Figure 2:
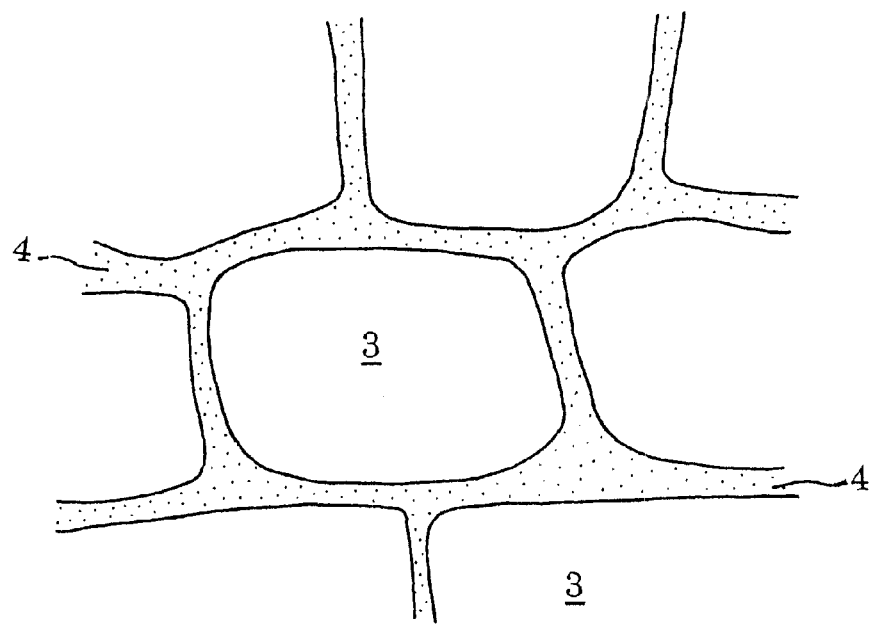
FIG. 2 is a schematic diagram of the crystal structure of silicon-based polycrystals.

As shown in FIG. 2, the silicon-based polycrystal particles 1 here are characterized by a structure comprising a crystal phase that does contain an added element but is mostly made up of silicon, with added element simultaneously segregated at the boundary of these crystal grains.

For the sake of discussion, the crystal phase made up of at least 80 at % silicon will be called a silicon-rich phase 3, while the grain boundary phase, at least half of which is made up of one or more added elements, will be called an added element-rich phase 4.

Depending on the amount of addition, the "added element-rich phase" can be anything from a phase that precipitates as if adhering to the silicon-rich phase, to a phase that precipitates so as to surround the silicon-rich phase in layer form, and refers to a crystal phase in which at least one type of added element has precipitated at the grain boundary of the silicon-rich phase. A trace amount of silicon also sometimes precipitates at the grain boundary.

"Added element" here is an element with which silicon can be converted into a p-type or n-type semiconductor. Specifically, it includes elements that generate carriers, as well as elements that do not generate carriers. Therefore, "added element" by itself refers both to elements that generate carriers and to elements that do not generate carriers, and when one or the other is to be specified, it will be referred to as elements that generate carriers or elements that do not generate carriers.

The silicon-based polycrystal particles are such that the conduction of carriers is increased by an added element-rich phase in which added element is clustered at the grain boundary, and a high Seebeck coefficient results from a silicon-rich phase (the main phase), and these particles have a structure in which the silicon-rich phase and the added element-rich phase are dispersed in the required layout within the material and a high figure of merit is obtained by controlling the cooling rate during melting and solidification. The size of the silicon-rich phase will vary with the cooling rate, but is about 10 to 500 μm.

The above-mentioned silicon-based polycrystals can be obtained by adding various elements to silicon. The added elements added to the silicon serve to lower the thermal conductivity over the required range of carrier concentration and, at the same time, to produce a high Seebeck coefficient, and basically any element that serves this purpose may be used. It is preferable for at least one element to be added in an amount between 0.001 and 30 at %.

In a preferred aspect, a single added element or a combination of added elements that do not generate carriers is or are contained in an amount of 0.1 to 10 at %, and a single added element or a combination of added elements that generate carriers is or are contained in an amount of 0.001 to 20 at %.

It is preferable for at least one of germanium, carbon, and tin to be contained as an added element that does not generate carriers. It is also possible to add a Group III or V element to germanium, carbon, or tin, or to add a Group III-V compound semiconductor or Group II-VI compound semiconductor in order to further lower the thermal conductivity.

If one or more of germanium, carbon, and tin are added in an amount less than 0.1 at %, thermal conductivity will be high and the desired performance will not be obtained, but if 10 at % is exceeded, thermal conductivity will drop somewhat, and the added element will diffuse into the silicon-rich phase, forming a solid solution, and this can decrease the high Seebeck coefficient of silicon and lower the figure of merit. Therefore, at least one of germanium, carbon, and tin is preferably contained in an amount of 0.1 to 10 at %, with 5 to 10 at % being even better.

If a Group III or V element, and especially a Group III-V compound semiconductor or a Group II-VI compound semiconductor, is added, then it is preferable for the combined amount of the one or more of germanium, carbon, and tin and the Group III or V element to be from 5 to 10 at %, or for the combined amount of the one or more of germanium, carbon, and tin and the Group III-V compound semiconductor or Group II-VI compound semiconductor to be from 1 to 10 at %.

As to the added elements that generate carriers, it is preferable for the added element used to make the resulting thermoelectric conversion material into a p-type semiconductor (called added element Cp), and the added element used to make it into an n-type semiconductor (called added element Cn) each to be contained in an amount of 0.001 to 10 at %.

The added element Cp that generates carriers and is used to produce a p-type semiconductor can be Be, Mg, Ca, Sr, Ba, Zn, Cd, Hg, B, Al, Ga, In, or Tl, all of which are commonly used, or it can be one or more elements selected from among the transition metal elements of Y, Mo, and Zr, B, Ga, and Al are particularly favorable as the added element Cp.

The added element Cn that generates carriers and is used to produce an n-type semiconductor can be N, P, As, Sb, Bi, O, S, Se, or Te, all of which are commonly used, or it can be one or more elements selected from among the transition metal elements of Ti, V, Cr, Mn, Fe, Co, Ni, Cu, Nb, Ru, Rh, Pd, Ag, Hf, Ta, W, Re, Os, Ir, Pt, and Au and the rare earth elements of La, Ce, Pr, Nd, Pm, Sm, Eu, Gd, Tb, Dy, Ho, Er, Yb, and Lu. P, As, Sb, and Cu are particularly favorable as this added element. When iron is selected as the added element Cn, it is added in an amount of 10 at % or less.

The above-mentioned silicon-based polycrystal material is obtained by cooling a melt, and arc melting and high-frequency melting are ideal as mass-production melting methods. The cooling rate is suitably selected according to the type and combination of the above-mentioned added elements, the cooling method being employed, and the form of the material, such as an ingot, thin sheet, substrate, or ribbon.

Cooling can be performed by a method in which the material is cooled while still in the form of an ingot, or a method that involves cooling while the crystals are being pulled. For example, a known CZ or FZ method for obtaining monocrystalline silicon can be utilized to pull and cool the crystals under conditions that yield polycrystalline silicon. Because they allow numerous substrates of the required thickness to be manufactured from a pulled rod ingot, the CZ and FZ methods are ideal for manufacturing a silicon-based substrate for a thermoelectric conversion element. Manufacture by the ZL method is also possible.

Any method may be employed, such as controlling the cooling rate so as to obtain a thin sheet of the required thickness by utilizing a method in which a thin sheet is produced by casting the melt into a shallow plate and cooling, or by using a known roll cooling method such as melt quenching.

In the present invention, the AGaT polycrystals are a clathrate compound having a complex cage structure, where A is at least one Group II-A element selected from among Be, Mg, Ca, Sr, and Ba, and T is at least one Group IV-A element selected from among C, Si, Ge, Sn, and Pb, and preferably the compositional formula is $A_X Ga_Y T_Z$, where X=8, Y=14 to 17, and Z=28 to 32. It is also preferable for the crystal grain diameter to be about 10 to 500 µm.

These AGaT polycrystals exhibit n-type conduction if Z in the above compositional formula is at least 31, and exhibit p-type conduction if Z is less than 31. Therefore, in the compounding of the above-mentioned silicon-based polycrystals, it is preferable to mix with AGaT polycrystals with n-type conduction (Z≧31) when the silicon-based polycrystals exhibit n-type conduction, and to mix with AGaT polycrystals with p-type conduction (Z<31) when the silicon-based polycrystals exhibit p-type conduction.

In the present invention, when the application of the thermoelectric conversion material is taken into account, the compounding ratio will vary with whether emphasis is placed on the Seebeck coefficient, electrical conductivity, or thermal conductivity according to the conditions of the application, such as the heat source, where the material will be used and its form, and the size of the current and voltage to be handled. Put the other way, the thermoelectric characteristics can be selected according to the application by varying the compounding ratio.

If the compounding weight ratio of the silicon-based polycrystals and the AGaT polycrystals is less than 60:40, that is, if the proportion of the silicon-based polycrystals is lowered, the Seebeck coefficient will decrease, but if the compounding ratio is over 90:10, there will be little decrease in thermal conductivity and no benefit to the compounding.

Therefore, it is preferable if the compounding ratio is set between 60:40 and 90:10, because there will be little decrease in the Seebeck coefficient, and furthermore thermal conductivity will be markedly reduced and the thermoelectric figure of merit will be improved. The figure of merit will be even better if the compounding ratio is between 70:30 and 80:20.

It is preferable for the compounding method to involve mixing the silicon-based polycrystal powder with the AGaT polycrystal powder, and this compounding this mixed powder by hot compression molding such as hot pressing or discharge plasma sintering.

The hot pressing conditions in the present invention preferably include a temperature of 673 to 973K and a pressure of 49 to 147 MP. The porosity of the sinter will increase if the temperature is under 673K, but there will be leakage between the punch and die if the temperature is over 973K. The pressure should be appropriately set so that compacting will be possible.

The discharge plasma sintering conditions in the present invention preferably include a temperature of 673 to 973K and a pressure of 49 to 147 MP. The porosity of the sinter will increase if the temperature is under 673K, but there will be leakage between the punch and die if the temperature is over 973K. The pressure should be appropriately set so that compacting of the composite will be possible.

EXAMPLES

Example 1

To produce silicon-based polycrystal powders, germanium was added as an added element that does not generate carriers to high-purity monocrystalline silicon (10N) to obtain a $Si_{1-x}Ge_x$ alloy, the various added elements shown in Table 1 were added in their specified proportions as added elements that generate carriers to the alloy obtained above, and the components were then arc melted in an argon gas atmosphere. The button-shaped ingots thus obtained were coarsely ground and then pulverized in a disc mill, after which they were pulverized in a jet mill to produce powders with the average crystal grain diameters shown in Table 1 and the figures of merits shown in Table 2.

To produce AGaT polycrystal powders, the elements shown in Table 3 were weighed out in their specified proportions, then arc melted in an argon gas atmosphere. The button-shaped ingots thus obtained were coarsely ground and then pulverized in a disc mill, after which they were pulverized in a jet mill to produce powders with the average crystal grain diameters shown in Table 3 and the characteristics shown in Table 4.

After this, the silicon-based polycrystal powders were mixed with the AGaT polycrystal powders in the ratios shown in Table 5, after which each mixture was held for 1 hour under the hot pressing conditions shown in Table 5 to produce a composite thermoelectric conversion material. In addition, powders were mixed in the ratios shown in Table 7, and each mixture was held for 3 minutes under the discharge plasma sintering conditions shown in Table 7 to produce a composite thermoelectric conversion material. The discharge plasma sintering apparatus used here was an SPS-2040 made by Izumitec.

Each of the composite thermoelectric conversion materials thus obtained was cut to sizes of 5×5×5 mm, 10×10×2 mm, and 10 (outside diameter)×2 mm to produce samples for measuring the Seebeck coefficient, the hole coefficient (including electrical resistance), and thermal conductivity, respectively.

To measure the Seebeck coefficient, platinum was used both for a high-temperature electrode and a low-temperature electrode, the temperature differential between these was set at 6K, the thermoelectromotive force of a p-type semiconductor was measured at an average temperature of 323K for the high- and low-temperature electrodes, and this thermoelectromotive force was then divided by 6K.

The measurement of the hole coefficient was performed by AC method at 323K, during which the electrical resistivity was also measured by four-probe method. The thermal conductivity was measured by laser flash method at 323K. These measurement results are shown in Tables 6 and 8. In determining whether a sample passed or failed, the sample passed if the figure of merit at 323K was over $0.8 \times 10^{-4}$ (1/K), and failed if less than this.

Comparative Example 1

Other than using only the raw material powders shown in Table 1 of Example 1, thermoelectric conversion materials were obtained by the same method as in Example 1. The blend ratios and molding conditions are given in Tables 9 and 11, while the results are given in Tables 10 and 12. The various characteristics were measured in the same manner as in Example 1.

TABLE 1

| Sample No. | Electrode type | Compositional formula $Si_{1-x}Ge_x$ | Added element | Added amount | Average crystal grain diameter ($\mu$m) |
|---|---|---|---|---|---|
| Example 1 | | | | | |
| A | P | $Si_{0.995}Ge_{0.005}$ | B | 0.2 at % | 4.2 |
| B | P | $Si_{0.95}Ge_{0.05}$ | B | 0.3 at % | 3.8 |
| C | N | $Si_{0.95}Ge_{0.05}$ | P | 0.4 at % | 4.0 |
| D | N | $Si_{0.8}Ge_{0.2}$ | GaP | 1.5 mol. % | 4.1 |
| | | | P | 0.4 at % | |

TABLE 2

| Sample No. | Carrier concentration ($cm^{-3}$) (at 323K) | Seebeck coefficient (mV/K) (at 323K) | Electrical resistivity ($\Omega$m) (at 323K) | Thermal conductivity (W/mK) (at 323K) |
|---|---|---|---|---|
| Example 1 | | | | |
| A | $0.92 \times 10^{20}$ | 0.190 | $1.8 \times 10^{-5}$ | 56.3 |
| B | $1.5 \times 10^{19}$ | 0.122 | $9.9 \times 10^{-5}$ | 11.5 |
| C | $1.8 \times 10^{20}$ | 0.143 | $8.4 \times 10^{-5}$ | 10.5 |
| D | $2.5 \times 10^{20}$ | 0.117 | $5.8 \times 10^{-5}$ | 5.2 |

TABLE 3

| Sample No. | Electrode type | Compositional formula | Composition (at %) Ba | Ge | Sn | Average crystal grain diameter ($\mu$m) |
|---|---|---|---|---|---|---|
| Example 1 | | | | | | |
| E | P | $Ba_8Ga_{15}Sn_{30}$ | 19.3 | 18.3 | 62.4 | 15.5 |
| F | P | $Ba_8Ga_{16}Sn_{30}$ | 19.0 | 19.3 | 61.7 | 16.7 |
| G | N | $Ba_8Ga_{14}Sn_{32}$ | 18.7 | 16.6 | 64.7 | 13.0 |
| H | N | $Ba_8Ga_{15}Sn_{32}$ | 18.5 | 17.6 | 63.9 | 12.2 |

TABLE 4

| Sample No. | Carrier concentration ($cm^{-3}$) (at 323K) | Seebeck coefficient (mV/K) (at 323K) | Electrical resistivity ($\Omega$m) (at 323K) | Thermal conductivity (W/mK) (at 323K) |
|---|---|---|---|---|
| Example 1 | | | | |
| E | $1.0 \times 10^{20}$ | 0.123 | $9.7 \times 10^{-6}$ | 1.0 |
| F | $6.4 \times 10^{19}$ | 0.164 | $6.1 \times 10^{-6}$ | 0.90 |
| G | $1.4 \times 10^{20}$ | 0.112 | $4.5 \times 10^{-6}$ | 0.76 |
| H | $5.1 \times 10^{20}$ | 0.088 | $6.2 \times 10^{-6}$ | 0.83 |

TABLE 5

| No. | Electrode type | Blend weight ratio Sample No. | SiGe | Sample No. | AGaB | Hot pressing conditions Temperature (K) | Pressure (MP) |
|---|---|---|---|---|---|---|---|
| 1 | P | A | 35 | E | 65 | 773 | 98 |
| 2 | P | A | 40 | E | 60 | 773 | 98 |
| 3 | P | A | 75 | E | 25 | 773 | 98 |
| 4 | P | A | 90 | E | 10 | 773 | 98 |
| 5 | P | A | 95 | E | 5 | 773 | 98 |
| 6 | P | A | 75 | E | 25 | 773 | 98 |
| 7 | P | B | 75 | F | 25 | 773 | 98 |
| 8 | P | C | 75 | G | 25 | 773 | 98 |
| 9 | P | C | 75 | H | 25 | 773 | 98 |
| 10 | P | D | 75 | G | 25 | 773 | 98 |
| 11 | P | D | 75 | H | 25 | 773 | 98 |

TABLE 6

| No. | Seebeck coefficient (mV/K) at 323K | Electrical resistivity ($\Omega$m) at 323K | Thermal conductivity (W/mK) at 323K | Figure of merit (1/K) at 323K |
|---|---|---|---|---|
| 1 | 0.163 | $1.47 \times 10^{-5}$ | 27.7 | $0.65 \times 10^{-4}$ |
| 2 | 0.158 | $1.51 \times 10^{-5}$ | 18.3 | $0.90 \times 10^{-4}$ |

TABLE 6-continued

| No. | Seebeck coefficient (mV/K) at 323K | Electrical resistivity (Ωm) at 323K | Thermal conductivity (W/mK) at 323K | Figure of merit (1/K) at 323K |
|---|---|---|---|---|
| 3 | 0.176 | $1.70 \times 10^{-5}$ | 21.4 | $0.85 \times 10^{-4}$ |
| 4 | 0.187 | $1.76 \times 10^{-5}$ | 24.6 | $0.81 \times 10^{-4}$ |
| 5 | 0.188 | $1.81 \times 10^{-5}$ | 26.3 | $0.74 \times 10^{-4}$ |
| 6 | 0.185 | $1.66 \times 10^{-5}$ | 21.5 | $0.96 \times 10^{-4}$ |
| 7 | 0.127 | $9.44 \times 10^{-6}$ | 4.81 | $3.55 \times 10^{-4}$ |
| 8 | 0.139 | $7.93 \times 10^{-6}$ | 4.53 | $5.38 \times 10^{-4}$ |
| 9 | 0.136 | $8.14 \times 10^{-6}$ | 4.43 | $5.13 \times 10^{-4}$ |
| 10 | 0.116 | $5.64 \times 10^{-6}$ | 2.74 | $8.71 \times 10^{-4}$ |
| 11 | 0.113 | $5.85 \times 10^{-6}$ | 2.18 | $10.0 \times 10^{-4}$ |

TABLE 7

| Electrode No. | trode type | Blend weight ratio Sample No. | SiGe | Sample No. | AGaB | Discharge plasma conditions Temperature (K) | Pressure (MP) |
|---|---|---|---|---|---|---|---|
| 12 | P | B | 75 | F | 25 | 873 | 49 |
| 13 | N | D | 75 | H | 25 | 873 | 49 |

TABLE 8

| No. | Seebeck coefficient (mV/K) at 323 K | Electrical resistivity (Ωm) at 323 K | Thermal conductivity (W/mK) at 323 K | Figure of merit (1/K) at 323 K |
|---|---|---|---|---|
| 12 | 0.121 | $9.82 \times 10^{-6}$ | 4.17 | $3.58 \times 10^{-4}$ |
| 13 | 0.105 | $6.07 \times 10^{-6}$ | 1.94 | $9.36 \times 10^{-4}$ |

TABLE 9

| Electrode No. | trode type | Blend weight ratio Sample No. | SiGe | Sample No. | AGaB | Hot pressing conditions Temperature (K) | Pressure (MP) |
|---|---|---|---|---|---|---|---|
| 14 | P | A | 100 | — | — | 773 | 98 |
| 15 | P | B | 100 | — | — | 773 | 98 |
| 16 | N | C | 100 | — | — | 773 | 98 |
| 17 | N | D | 100 | — | — | 773 | 98 |

TABLE 10

| No. | Seebeck coefficient (mV/K) at 323 K | Electrical resistivity (Ωm) at 323 K | Thermal conductivity (W/mK) at 323 K | Figure of merit (1/K) at 323 K |
|---|---|---|---|---|
| 14 | 0.189 | $1.8 \times 10^{-5}$ | 55 | $0.36 \times 10^{-4}$ |
| 15 | 0.115 | $9.9 \times 10^{-6}$ | 11.2 | $1.20 \times 10^{-4}$ |
| 16 | 0.138 | $8.4 \times 10^{-6}$ | 10.5 | $2.16 \times 10^{-4}$ |
| 17 | 0.112 | $5.8 \times 10^{-6}$ | 5.2 | $4.16 \times 10^{-4}$ |

TABLE 11

| Electrode No. | trode type | Blend weight ratio Sample No. | SiGe | Sample No. | AGaB | Discharge plasma conditions Temperature (K) | Pressure (MP) |
|---|---|---|---|---|---|---|---|
| 18 | P | B | 100 | — | — | 873 | 49 |
| 19 | N | D | 100 | — | — | 873 | 49 |

TABLE 12

| No. | Seebeck coefficient (mV/K) at 323 K | Electrical resistivity (Ωm) at 323 K | Thermal conductivity (W/mK) at 323 K | Figure of merit (1/K) at 323 K |
|---|---|---|---|---|
| 18 | 0.113 | $10.8 \times 10^{-6}$ | 10.8 | $1.09 \times 10^{-4}$ |
| 19 | 0.108 | $6.1 \times 10^{-6}$ | 5.0 | $3.82 \times 10^{-4}$ |

What is claimed is:

1. A thermoelectric conversion material that is a composite of silicon-based polycrystals and AGaT polycrystals where A is at least one Group II-A element selected from among Be, Mg, Ca, Sr, and Ba, and T is at least one Group IV-A element selected from among C, Si, Ge, Sn, and Pb;

said silicon-based polycrystals having a crystal structure containing an added element or a combination of added elements in an amount of 0.001 to 30 at % and including crystal grains made up of at least 80 at % silicon, and a grain boundary phase where at least one type of said added element is precipitated at the boundary of said crystal grains.

2. The thermoelectric conversion material according to claim 1, having a composite structure in which the particles of the AGaT polycrystals are disposed around the particles of the silicon-based polycrystals.

3. The thermoelectric conversion material according to claim 1, the added element in the silicon-based polycrystals including 0.1 to 10 at % of at least one type of added element that does not generate carriers and 0.002 to 20 at % of at least one type of added element that does generate carriers, and the added element that does generate carriers including at least one element selected from among Ge, C, and Sn.

4. The thermoelectric conversion material according to claim 1, the AGaT polycrystals having a compositional formula of $A_X Ga_Y T_Z$, where X=8, Y=14 to 17, and Z=28 to 32.

5. The thermoelectric conversion material according to claim 1, the silicon-based polycrystals being of the same conduction type as the AGaT polycrystals.

6. The thermoelectric conversion material according to claim 1, the mixing weight ratio of the silicon-based polycrystals and the AGaT polycrystals being 60:40 to 90:10.

7. A method for manufacturing a thermoelectric conversion material, comprising the steps of:

preparing a silicon-based polycrystal powder having a crystal structure containing an added element or a combination of added elements in an amount of 0.001 to 30 at % and including crystal grains made up of 80 at % silicon, and a grain boundary phase where at least one of said added element is precipitated at the boundary of said crystal grains, and an AGaT polycrystal powder where A is at least one Group II-A element selected from among Be, Mg, Ca, Sr, and Ba, and T is at least one Group IV-A element selected from among C, Si, Ge, Sn, and Pb;

mixing the silicon-based polycrystal powder with the AGaT polycrystal powder; and compounding the mixed powder thus obtained by hot compression molding.

8. The method for manufacturing a thermoelectric conversion material according to claim 7, wherein the step of compounding by hot compression molding involves forming a composite structure in which the particles of the AGaT polycrystals are disposed around the particles of the silicon-based polycrystals.

9. The method for manufacturing a thermoelectric conversion material according to claim 7, wherein the hot compression molding method is hot pressing or discharge plasma sintering.

* * * * *